(12) United States Patent
Chen et al.

(10) Patent No.: US 11,910,661 B2
(45) Date of Patent: Feb. 20, 2024

(54) DISPLAY SUBSTRATE FOR DOUBLE-SIDED DISPLAY AND MANUFACTURING METHOD THEREOF, DISPLAY PANEL AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Chenyu Chen, Beijing (CN); Yuhsiung Feng, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 416 days.

(21) Appl. No.: 17/287,064

(22) PCT Filed: May 26, 2020

(86) PCT No.: PCT/CN2020/092349
§ 371 (c)(1),
(2) Date: Apr. 20, 2021

(87) PCT Pub. No.: WO2020/253479
PCT Pub. Date: Dec. 24, 2020

(65) Prior Publication Data
US 2021/0359060 A1    Nov. 18, 2021

(30) Foreign Application Priority Data

Jun. 20, 2019 (CN) .......................... 201910534540.0

(51) Int. Cl.
*H10K 59/128* (2023.01)
*B06B 1/06* (2006.01)
(Continued)

(52) U.S. Cl.
CPC ......... *H10K 59/128* (2023.02); *B06B 1/0688* (2013.01); *H10K 59/00* (2023.02); *H10K 71/00* (2023.02); *H10K 59/1201* (2023.02)

(58) Field of Classification Search
CPC .................................................. H10K 59/128
(Continued)

(56) References Cited

U.S. PATENT DOCUMENTS 10,403,703 B2   9/2019   Yamazaki
10,691,911 B2   6/2020   Han et al.
(Continued)

FOREIGN PATENT DOCUMENTS

CN    101373576 A    2/2009
CN    104409473 A    3/2015
(Continued)

OTHER PUBLICATIONS

First Chinese Office Action dated Aug. 19, 2021, received for corresponding Chinese Application No. 201910534540.0, 12 pages.

*Primary Examiner* — Ajay Arora
(74) *Attorney, Agent, or Firm* — Kinney & Lange, P.A.

(57) ABSTRACT

A display substrate includes: a base substrate having a first side and a second side opposite to each other; a transmitter arranged on the first side of the base substrate, and configured to convert a first display electrical signal into a conduction signal; a first light-emitting element arranged on a side of the transmitter away from the base substrate, wherein the first light-emitting element emits light under a driving action of the first display electrical signal; a receiver arranged on the second side of the base substrate, and
(Continued)

configured to receive the conduction signal and convert the conduction signal into a second display electrical signal; and a second light-emitting element arranged on a side of the receiver away from the base substrate, wherein the second light-emitting element emits light under a driving action of the second display electrical signal.

20 Claims, 2 Drawing Sheets

(51) Int. Cl.
*H10K 59/00* (2023.01)
*H10K 71/00* (2023.01)
*H10K 59/12* (2023.01)

(58) Field of Classification Search
USPC .......................................................... 257/40
See application file for complete search history.

(56) References Cited

U.S. PATENT DOCUMENTS

| 2005/0151830 | A1* | 7/2005 | Yamazaki | ................ G09G 3/20 |
| | | | | 347/238 |
| 2016/0011442 | A1 | 1/2016 | Lee et al. | |
| 2019/0095015 | A1 | 3/2019 | Han et al. | |
| 2022/0238618 | A1* | 7/2022 | Wang | .................... G06F 3/0443 |

FOREIGN PATENT DOCUMENTS

| CN | 106463082 A | 2/2017 |
| CN | 106951130 A | 7/2017 |
| CN | 107657922 A | 2/2018 |
| CN | 108365118 A | 8/2018 |
| CN | 108899353 A | 11/2018 |
| CN | 109244108 A | 1/2019 |
| CN | 109492467 A | 3/2019 |
| CN | 110197844 A | 9/2019 |
| JP | 2004152612 A | 5/2004 |

* cited by examiner

DISPLAY SUBSTRATE FOR DOUBLE-SIDED DISPLAY AND MANUFACTURING METHOD THEREOF, DISPLAY PANEL AND DISPLAY DEVICE

CROSS REFERENCE TO RELATED APPLICATION(S)

This application is a Section 371 National Stage Application of International Application No. PCT/CN2020/092349, filed on May 26, 2020, entitled "DISPLAY SUBSTRATE AND MANUFACTURING METHOD THEREOF, DISPLAY PANEL AND DISPLAY DEVICE," which claims priority to Chinese patent Application No. CN201910534540.0, filed on Jun. 20, 2019, the content of which are incorporated herein by reference in their entirety.

TECHNICAL FIELD

The present disclosure relates to a field of display technology, and in particular to a display substrate and a manufacturing method thereof, a display panel, and a display device.

BACKGROUND

OLED display panels have advantages of self-luminescence, wide viewing angle, high contrast, low power consumption, high response rate, full color, and simple manufacturing process. General OLED display panels may only achieve a function of single-sided display, and may not meet requirements of use in some use environments that require double-sided display. At present, two display panels are usually provided to realize the double-sided display. However, this manner requires two independent display panels, which has a complicated structure and high cost.

SUMMARY

According to an aspect of the present disclosure, the embodiments of the present disclosure provide a display substrate, including: a base substrate having a first side and a second side opposite to each other; a transmitter arranged on the first side of the base substrate, and configured to convert a first display electrical signal into a conduction signal; a first light-emitting element arranged on a side of the transmitter away from the base substrate, wherein the first light-emitting element emits light under a driving action of the first display electrical signal; a receiver arranged on the second side of the base substrate, and configured to receive the conduction signal and convert the conduction signal into a second display electrical signal; and a second light-emitting element arranged on a side of the receiver away from the base substrate, wherein the second light-emitting element emits light under a driving action of the second display electrical signal.

According to some embodiments of the present disclosure, the conduction signal is an ultrasonic signal or an optical signal.

According to some embodiments of the present disclosure, a driving circuit is provided on the first side of the base substrate, and no driving circuit is provided on the second side of the base substrate.

According to some embodiments of the present disclosure, the transmitter is a piezoelectric transmitter, and the receiver is a piezoelectric receiver.

According to some embodiments of the present disclosure, the transmitter includes: a first transmitting electrode and a second transmitting electrode arranged opposite to each other; and a first piezoelectric material layer located between the first transmitting electrode and the second transmitting electrode, wherein the first piezoelectric material layer has an inverse piezoelectric effect.

According to some embodiments of the present disclosure, the receiver includes: a first receiving electrode and a second receiving electrode arranged opposite to each other; and a second piezoelectric material layer located between the first receiving electrode and the second receiving electrode, wherein the second piezoelectric material layer has a positive piezoelectric effect.

According to some embodiments of the present disclosure, an orthographic projection of a pattern of the first piezoelectric material layer on the base substrate and an orthographic projection of a pattern of the second piezoelectric material layer on the base substrate at least partially overlap, wherein the pattern of the first piezoelectric material layer is in a section perpendicular to the base substrate, and the pattern of the second piezoelectric material layer is in a section perpendicular to the base substrate.

According to some embodiments of the present disclosure, an orthographic projection of a pattern of the second piezoelectric material layer on the base substrate covers an orthographic projection of a pattern of the first piezoelectric material layer on the base substrate, wherein the pattern of the first piezoelectric material layer is in a section perpendicular to the base substrate, and the pattern of the second piezoelectric material layer is in a section perpendicular to the base substrate.

According to some embodiments of the present disclosure, the first piezoelectric material layer includes a piezoelectric crystal or a piezoelectric polymer film; and the second piezoelectric material layer includes a piezoelectric crystal or a piezoelectric polymer film.

According to some embodiments of the present disclosure, the first light-emitting element includes a first electrode and a second electrode arranged opposite to each other, and a first light-emitting layer located between the first electrode and the second electrode, and wherein the second light-emitting element includes a third electrode and a fourth electrode arranged opposite to each other, and a second light-emitting layer located between the third electrode and the fourth electrode.

According to some embodiments of the present disclosure, the transmitter includes a first transmitting electrode and a second transmitting electrode; and wherein the first transmitting electrode is electrically coupled to the first electrode of the first light-emitting element, and the second transmitting electrode is electrically coupled to a first reference potential.

According to some embodiments of the present disclosure, the display substrate further includes: a thin film transistor arranged on the first side of the base substrate, and wherein both the first transmitting electrode and the first electrode are electrically coupled to a source electrode of the thin film transistor, or both the first transmitting electrode and the first electrode are electrically coupled to a drain electrode of the thin film transistor.

According to some embodiments of the present disclosure, the receiver includes a first receiving electrode and a second receiving electrode, and wherein the first receiving electrode is electrically coupled to the third electrode of the second light-emitting element, and the second receiving electrode is electrically coupled to a second reference potential.

According to some embodiments of the present disclosure, the display substrate further includes a compensation circuit, and wherein the compensation circuit is configured to compensate the conduction signal or the second display electrical signal, so that the second display electrical signal is substantially the same as the first display electrical signal.

According to some embodiments of the present disclosure, the compensation circuit is arranged on the second side of the base substrate.

According to another aspect of the present disclosure, the embodiments of the present disclosure provide a method for manufacturing the display substrate according to any one of the embodiments described above, including: forming the transmitter and the first light-emitting element on the first side of the base substrate and forming the receiver and second light-emitting element on the second side of the base substrate.

According to some embodiments of the present disclosure, a method for manufacturing a display substrate includes: providing a base substrate having a first side and a second side opposite to each other; forming a transmitter on the first side of the base substrate, wherein the transmitter is configured to convert a first display electrical signal into a conduction signal; forming a first light-emitting element on a side of the transmitter away from the base substrate, wherein the first light-emitting element emits light under a driving action of the first display electrical signal; forming a receiver on the second side of the base substrate, wherein the receiver is configured to receive the conduction signal and convert the conduction signal into a second display electrical signal; and forming a second light-emitting element on a side of the receiver away from the base substrate, wherein the second light-emitting element emits light under a driving action of the second display electrical signal.

According to some embodiments of the present disclosure, the steps of forming the transmitter and the first light-emitting element on the first side of the base substrate and forming the receiver and the second light-emitting element on the second side of the base substrate include: forming the transmitter and the first light-emitting element on the first side of the base substrate; and forming the receiver and the second light-emitting element on the second side of the base substrate; or the steps of forming the transmitter and the first light-emitting element on the first side of the base substrate and forming the receiver and the second light-emitting element on the second side of the base substrate include: forming the receiver and the second light-emitting element on the second side of the base substrate; and forming the transmitter and the first light-emitting element on the first side of the base substrate.

According to some embodiments of the present disclosure, the steps of forming the transmitter and the first light-emitting element on the first side of the base substrate and forming the receiver and the second light-emitting element on the second side of the base substrate include: forming the transmitter on the first side of the base substrate; forming a first electrode of the first light-emitting element on a side of the transmitter away from the base substrate; forming the receiver on the second side of the base substrate; forming a third electrode of the second light-emitting element on a side of the receiver away from the base substrate; forming a first light-emitting layer of the first light-emitting element on a surface of the first electrode away from the base substrate; forming a second light-emitting layer of the second light-emitting element on a surface of the third electrode away from the base substrate; forming a second electrode of the first light-emitting element on a surface of the first light-emitting layer away from the base substrate; and forming a fourth electrode of the second light-emitting element on a surface of the second light-emitting layer away from the base substrate.

According to some embodiments of the present disclosure, the forming a first light-emitting element on a side of the transmitter away from the base substrate includes: forming a first electrode of the first light-emitting element on a side of the transmitter away from the base substrate; forming a first light-emitting layer of the first light-emitting element on a surface of the first electrode away from the base substrate; and forming a second electrode of the first light-emitting element on a surface of the first light-emitting layer away from the base substrate.

According to some embodiments of the present disclosure, the forming a second light-emitting element on a side of the receiver away from the base substrate includes: forming a third electrode of the second light-emitting element on a side of the receiver away from the base substrate; forming a second light-emitting layer of the second light-emitting element on a surface of the third electrode away from the base substrate; and forming a fourth electrode of the second light-emitting element on a surface of the second light-emitting layer away from the base substrate.

According to yet another aspect of the present disclosure, the embodiments of the present disclosure provide a display panel including the display substrate according to any one of the embodiments described above.

According to still another aspect of the present disclosure, the embodiments of the present disclosure provide a display device including the display panel according to the embodiments described above.

DETAILED DESCRIPTION OF EMBODIMENTS

The embodiments of the present disclosure are described in detail below. The embodiments described below are exemplary, and are only used to explain the present disclosure, and should not be construed as limiting the present disclosure. Where specific techniques or conditions are not indicated in the embodiments, the procedures should be carried out in accordance with the techniques or conditions described in the literatures in the field or in accordance with the product specifications. The reagents or instruments used without indicating manufacturers are all conventional products that are commercially available.

The embodiments of the present disclosure aim to solve one of the technical problems in the related art at least to a certain extent. To this end, a purpose of the present disclosure is to provide a display substrate that may realize double-sided display without using two display panels, a manufacturing method thereof, a display panel, and a display device.

Figure 1:
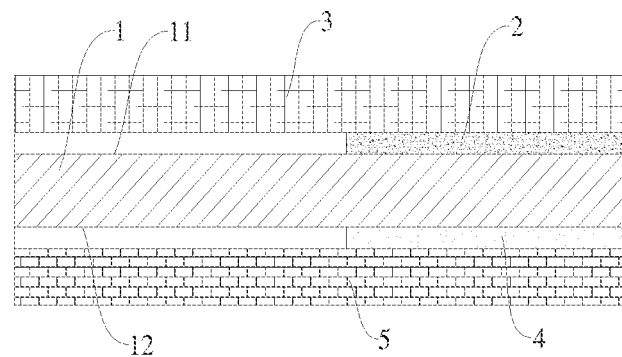
FIG. 1 is a schematic structural diagram of a display substrate according to the embodiments of the present disclosure.

According to an aspect of the present disclosure, the embodiments of the present disclosure provide a display substrate. According to the embodiments of the present disclosure, referring to FIG. 1, the display substrate includes: a base substrate 1 having a first side 11 and a second side 12 opposite to each other; a transmitter 2 arranged on the first side 11 and configured to convert a first display electrical signal into a conduction signal; a first light-emitting element 3 arranged on a side of the base substrate 1 facing the transmitter 2, in which, specifically, the first light-emitting element 3 is arranged on a side of the transmitter 2 away from the base substrate 1 and emits light under a driving action of the first display electrical signal; the receiver 4 arranged on the second side 12 and configured to receive the conduction signal and convert the conduction signal into a second display electrical signal; and the second light-emitting element 5 arranged on a side of the base substrate 1 facing the receiver 4, in which, specifically, the second light-emitting element 5 is arranged on a side of the receiver 4 away from the base substrate 1 and emits light under a driving action of the second display electrical signal. In the display substrate, the transmitter may convert the first display electrical signal that drives the first light-emitting element to emit light and transmit the first display electrical signal to the receiver, and the receiver may convert the received conduction signal into the second display electrical signal that drives the second light-emitting element to emit light. Therefore, only need to apply the first display electrical signal on a side of the base substrate, both the first light-emitting element and the second light-emitting element may emit light, and both sides of the display substrate may realize display functions. The structure of the display substrate is simple, the cost of the display substrate is low, and the occupied volume of the display substrate is small.

According to some embodiments of the present disclosure, specific types of the base substrate are not particularly limited, including but not limited to a rigid substrate or a flexible substrate, and specifically may be a glass substrate, a polymer substrate, and the like.

According to some embodiments of the present disclosure, specific types and structures of the first light-emitting element are also not particularly limited, as long as the first light-emitting element may be driven by the first display electrical signal to emit light, so as to display a picture. Specifically, the first light-emitting element may be an OLED light-emitting element, which may include two electrodes arranged opposite to each other and a light-emitting layer located between the two electrodes. Specifically, referring to FIG. 2, the first light-emitting element may include: a first electrode 31 and a second electrode 33 arranged opposite to each other; and a first light-emitting layer 32 located between the first electrode 31 and the second electrode 33. The first electrode 31 and the second electrode 33 may be coupled according to an electrical coupling relationship of a conventional display substrate, which will not be repeated here.

According to some embodiments of the present disclosure, specific types and structures of the second light-emitting element are also not particularly limited, as long as the second light-emitting element may be driven by the second display electrical signal to emit light, so as to display a picture. Specifically, the second light-emitting element may be an OLED light-emitting element, which may include two electrodes arranged opposite to each other and a light-emitting layer located between the two electrodes. Specifically, referring to FIG. 2, the second light-emitting element may include: a third electrode 51 and a fourth electrode 53 arranged opposite to each other; and a second light-emitting layer 52 located between the third electrode 51 and the fourth electrode 53. As described above, the second light-emitting element emits light under the driving action of the second display electrical signal. Therefore, the third electrode 51 may be electrically coupled to the receiver, so as to transmit the second display electrical signal to the second light-emitting element. The fourth electrode 53 may be electrically coupled to a reference potential.

According to some embodiments of the present disclosure, specific types of the conduction signal are not particularly limited, as long as the conduction signal may be effectively converted and conducted, for example, including but not limited to an ultrasonic signal or an optical signal. As a result, the conduction signal may be easily transmitted, converted and received, and a fidelity effect of the conduction signal is good. In some specific embodiments, the conduction signal is an ultrasonic signal. As a result, there is almost no energy loss during a conversion and conduction process, and the fidelity effect of the signal is better, so that display pictures on both sides of the display panel provided with the display substrate are highly consistent, and display appearances of the display pictures are better.

According to some embodiments of the present disclosure, specific setting manners of the transmitter are not particularly limited, as long as the transmitter may effectively convert a first display electrical signal that drives the first light-emitting element to emit light into a conduction signal and transmit the conduction signal to the receiver. For example, the transmitter may be separately coupled to a signal line, so as to transmit the first display electrical signal, or the transmitter may be coupled to an existing structure of the display substrate, and the existing structure of the display substrate is used to transmit the first display electrical signal to the transmitter. In some specific embodiments, referring to FIG. 2, the transmitter has a first transmitting electrode 21 and a second transmitting electrode 23, and the first transmitting electrode 21 is electrically coupled to the first electrode 31 of the first light-emitting element 3. The second transmitting electrode 23 is electrically coupled to a first reference potential. Therefore, the first electrode of the first light-emitting element may transmit the first display electrical signal to the transmitter, and there is no need to additionally provide a separate transmission signal line, thereby simplifying the structure of the display substrate and saving manufacturing cost.

Those skilled in the art may understand that, the display substrate may further include a thin film transistor. In some specific embodiments, referring to FIG. 3, the first transmitting electrode 21 and the first electrode 31 are both coupled to a source electrode 61 of the thin film transistor. In other specific embodiments, the first transmitting electrode 21 and the first electrode 31 are both electrically coupled to a drain electrode 62 of the thin film transistor. Therefore, the existing structure of the display substrate may be used to transmit the first display electrical signal and the reference potential to the transmitter, so that the structure of the display substrate is simple, the volume of the display substrate is small, the display substrate is easy to manufacture, and the cost of the display substrate is low.

Figure 2:
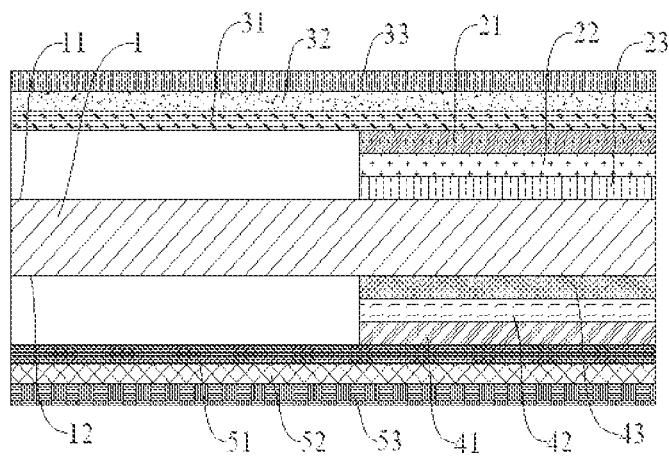
FIG. 2 is a schematic structural diagram of a display substrate according to the embodiments of the present disclosure.

According to some embodiments of the present disclosure, referring to FIG. 2, the receiver has a first receiving electrode 41 and a second receiving electrode 43, and the first receiving electrode 41 is electrically coupled to the third electrode 51 of the second light-emitting element, and the second receiving electrode 43 is electrically coupled to a second reference potential. Therefore, the receiver may effectively transmit the second display electrical signal to the second light-emitting element, and the structure of the display substrate is simple, and the cost for manufacturing the display substrate is low.

According to some embodiments of the present disclosure, the specific types of the transmitter and the receiver may be selected according to actual needs. In some specific embodiments, the transmitter may be a piezoelectric transmitter, and the receiver may be a piezoelectric receiver. Therefore, the transmitter and the receiver have advantages such as wide frequency bandwidth, high sensitivity, high signal-to-noise ratio, simple structure, reliable operation and light weight.

Figure 3:
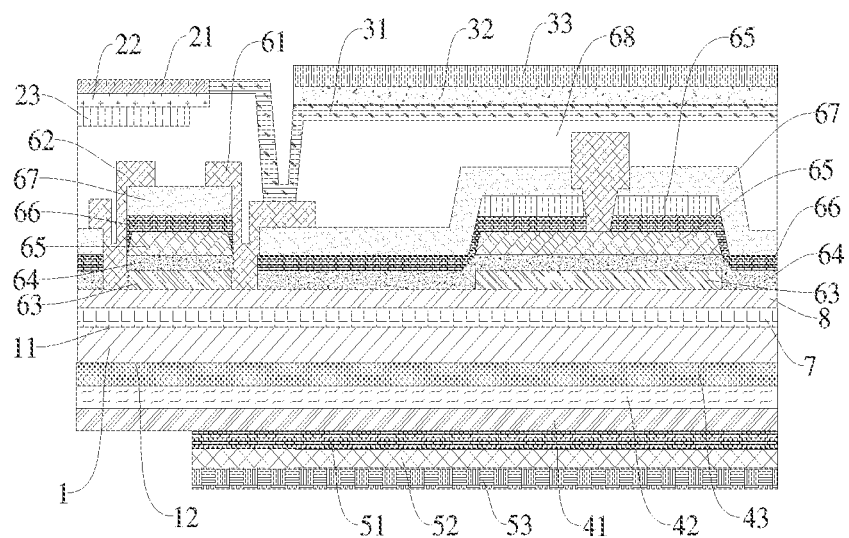
FIG. 3 is a schematic structural diagram of a display substrate according to the embodiments of the present disclosure.

According to some embodiments of the present disclosure, referring to FIG. 3, the transmitter includes: a first transmitting electrode 21 and a second transmitting electrode 23 arranged opposite to each other; and a first piezoelectric material layer 22 located between the first transmitting electrode 21 and the second transmitting electrode 23. The first piezoelectric material layer 22 has an inverse piezoelectric effect. Specifically, the inverse piezoelectric effect refers to: when an electric field is applied in a polarization direction of the first piezoelectric material layer, the first piezoelectric material layer generates mechanical deformations or mechanical pressures in a certain direction. When the applied electric field is removed, these deformations or pressures disappear. The inverse piezoelectric effect is substantially a process of converting electrical energy into mechanical energy. In some specific embodiments, the first piezoelectric material layer may include a piezoelectric crystal or a piezoelectric polymer film. The first piezoelectric material layer deforms and generates mechanical vibration under a voltage applied by the first transmitting electrode and the second transmitting electrode. By adjusting the voltage to make a vibration frequency of the first piezoelectric material layer reach above 20 KHZ, the ultrasonic signal may be sent out. The first transmitting electrode 21 and the second transmitting electrode 23 may be flexibly selected according to the efficiencies of the device, and the first transmitting electrode 21 and the second transmitting electrode 23 may include conventional conductive materials, for example, metal electrodes, transparent conductive oxide electrodes and so on.

According to some embodiments of the present disclosure, referring to FIG. 3, the receiver includes: a first receiving electrode 41 and a second receiving electrode 43 arranged opposite to each other; and a second piezoelectric material layer 42 located between the first receiving electrode 41 and the second receiving electrode 43. The second piezoelectric material layer 42 has a positive piezoelectric effect. Specifically, the positive piezoelectric effect refers to: a phenomenon of electrical polarization due to a deformation. When a physical pressure is applied to the second piezoelectric material layer, an electric dipole moment in the second piezoelectric material layer may be shortened due to a compression. At this time, in order to resist this change, the second piezoelectric material layer may generate equal positive charges and negative charges on opposite surfaces of the second piezoelectric material layer to maintain an original shape thereof. This phenomenon of electrical polarization due to the deformation is called "positive piezoelectric effect". The positive piezoelectric effect is substantially a process of converting mechanical energy into electrical energy. In some specific embodiments, the second piezoelectric material layer may include a piezoelectric crystal or a piezoelectric polymer film, which may generate the second display electrical signal under an action of the ultrasonic signal. The first receiving electrode 41 and the second receiving electrode 43 may be flexibly selected according to efficiencies of the device. Specifically, the first receiving electrode 41 and the second receiving electrode 43 may include conventional conductive materials, for example, metal electrodes, transparent conductive oxide electrodes and so on. The base substrate 11 may transmit the ultrasonic signal sent by the first piezoelectric material layer, so that the ultrasonic signal may be transmitted from the first piezoelectric material layer to the base substrate, and then to the second piezoelectric material layer.

According to some embodiments of the present disclosure, referring to FIG. 3, an orthographic projection of the first piezoelectric material layer 22 on the base substrate 1 and an orthographic projection of the second piezoelectric material layer 42 on the base substrate 1 at least partially overlap. As a result, a transmission effect of the conduction signal may be improved, a loss during a transmission process is small, a fidelity effect of the signal is good, and the consistency of the double-sided display is high.

Those skilled in the art may understand that, in order to realize the display function, on a side of the base substrate provided with the transmitter, in addition to the structures described above, the display substrate may further include structures and components of a conventional display substrate. Specifically, referring to FIG. 3, the display substrate may further include: a flexible substrate 7, a buffer layer 8, an active layer 63, a first gate insulating layer 64, a gate electrode 65, a second gate insulating layer 66, an interlayer insulating layer 67, and a planarization layer 68. From the foregoing description, it may be seen that the second light-emitting element may realize the display function through the signal converted by the receiver. Therefore, only the receiver and the second light-emitting element need to be provided on a side of the base substrate provided with the receiver, and no other driving circuits or structures are required, which makes the display substrate simple in structure, easy to manufacture, thin in thickness, and compact in size.

Figure 4:
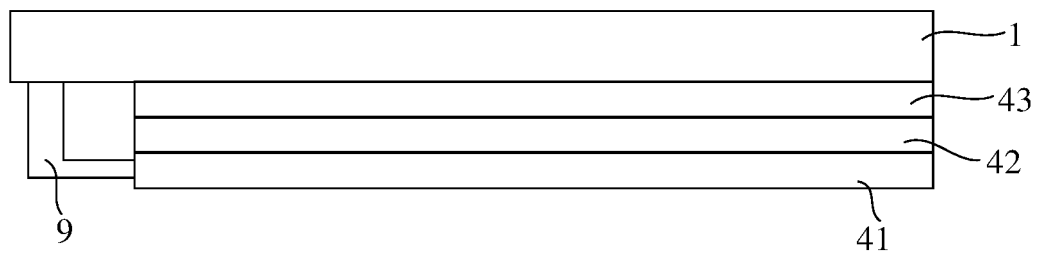
FIG. 4 is schematic partial structural diagram of a display substrate according to the embodiments of the present disclosure, in which a compensation circuit is shown.

According to some embodiments of the present disclosure, referring to FIG. 4, in order to achieve a better display effect, the display substrate may further include a compensation circuit 9, which makes the second display electrical signal substantially consistent with the first display electrical signal. As a result, the consistency of double-sided display may be improved. Specifically, structures and installation locations of the compensation circuit are not particularly limited. For example, the compensation may be performed in the transmitter or receiver. The compensation circuit 9 may be provided on the second side of the base substrate 1, so that more space may be used, the circuit design is less restricted, and the design flexibility is higher. The specific circuit structure may be flexibly designed according to actual voltages or current requirements, which will not be repeated here.

In the display substrate of the embodiments of the present disclosure, the transmitter may transmit the first display electrical signal that drives the first light-emitting element to emit light to the receiver, and the receiver convert the first display electrical signal into the second display electrical signal that drives the second light-emitting element to emit light. The display functions may be realized on both a front side and a back side of the display panel including the display substrate, so that the structure of the display substrate is simple, the cost of the display substrate is low, and the occupied volume of the display substrate is small.

According to another aspect of the present disclosure, the embodiments of the present disclosure provide a method for manufacturing the display substrate described above. According to the embodiments of the present disclosure, the method includes: forming a transmitter on a first side of a base substrate; forming a receiver on a second side of the base substrate; forming a first light-emitting element on a side of the base substrate facing the transmitter, specifically, forming the first light-emitting element on a side of the transmitter away from the base substrate; and forming a second light-emitting element on a side of the base substrate facing the receiver, specifically, forming the second light-emitting element on a side of the receiver away from the base substrate. The method is simple in steps, convenient to operate, does not have harsh requirements on technicians and equipment, and is easy to realize industrial production, and the obtained display substrate may enable a display panel including the display substrate to realize double-sided display, which is simple in structure, low in cost, and compact in size as opposed to a solution of using two display panels.

According to some embodiments of the present disclosure, an order of the above steps is not particularly limited, and may be selected according to actual process conditions. According to some specific embodiments of the present disclosure, the method may include: forming a transmitter on a first side of a base substrate; forming a first electrode of a first light-emitting element on a side of the base substrate facing the transmitter; forming a receiver on a second side of the base substrate; forming a third electrode of the second light-emitting element on a side of the base substrate facing the receiver; forming a first light-emitting layer of the first light-emitting element on a surface of the first electrode away from the base substrate; forming a second light-emitting layer of the second light-emitting element on a surface of the third electrode away from the base substrate; forming a second electrode of the first light-emitting element on a surface of the first light-emitting layer away from the base substrate; and forming a fourth electrode of the second light-emitting element on a surface of the second light-emitting layer away from the base substrate.

According to some embodiments of the present disclosure, the transmitter, the light-emitting element, and the receiver may be formed by using conventional semiconductor processes. Specifically, processes of deposition and photolithography may be used to form, for example, the transmitter. Firstly, a whole electrode layer may be deposited on the base substrate. Then a photoresist is coated on the electrode layer, and the photoresist is exposed and developed sequentially to obtain a patterned photoresist. Then the electrode layer not covered by the photoresist is etched, and the patterned photoresist is stripped to obtain a second transmitting electrode. Then the same process steps are used to sequentially form the first piezoelectric material layer and the first transmitting electrode on the surface of the second transmitting electrode away from the base substrate. The light-emitting element and the receiver may be performed with reference to these steps. Therefore, the steps are simple, highly compatible with existing apparatuses and technologies, and are easy to implement.

According to still another aspect of the present disclosure, the embodiments of the present disclosure provide a display panel. According to the embodiments of the present disclosure, the display panel includes the display substrate described above. The display panel only needs one side to be driven to realize double-sided display, and has a thinner thickness, a smaller volume, and a better display effect.

Those skilled in the art may understand that, in addition to the display substrate described above, the display panel further includes necessary structures and components of a conventional display panel. For example, the display panel may further include a color film substrate, a packaging structure, etc., for details, please refer to settings of the conventional display panel, which will not be repeated here.

According to another aspect of the present disclosure, the embodiments of the present disclosure provide a display device. According to the embodiments of the present disclosure, the display device includes the display panel described above. The display device only needs one side to be driven to realize double-sided display, and has a thinner thickness, a smaller volume, and a better display effect.

Those skilled in the art may understand that specific types of the display device is not particularly limited, and includes, but is not limited to, mobile phones, televisions, desktop computers, tablet computers, game consoles, wearable devices, and so on. In addition to the display panel described above, the display device further includes necessary structures and components of a conventional display device. For details, please refer to the configuration of the conventional display panel, which will not be repeated here.

In the description of the present disclosure, it should be understood that the terms "first" and "second" are only used for descriptive purposes, and may not be understood as indicating or implying relative importance or implicitly indicating a number of indicated technical features. Thus, the features defined with "first" and "second" may explicitly or implicitly include one or more of these features. In the description of the present disclosure, "plurality" means two or more than two, unless specifically defined otherwise.

In the description of this specification, descriptions with reference to the terms "an embodiment", "some embodiments", "examples", "specific examples", or "some examples" etc. mean specific features, structures, materials, or characteristics described in conjunction with the embodiments are included in at least one embodiment or example of the present disclosure. In this specification, the schematic representations of the above-mentioned terms do not necessarily refer to the same embodiment or example. Moreover, the described specific features, structures, materials or characteristics may be combined in any one or more embodiments or examples in a suitable manner. In addition, those skilled in the art may combine and group the different embodiments or examples and features of the different embodiments or examples described in this specification without contradicting each other.

Although the embodiments of the present disclosure are shown and described above, it may be understood that the above-mentioned embodiments are exemplary and should not be construed as limiting the present disclosure. Those ordinary skilled in the art may make changes, modifications, substitutions and variants to the above-mentioned embodiments within the scope of the present disclosure.

What is claimed is:
1. A display substrate, comprising:
a base substrate having a first side and a second side opposite to each other;
a transmitter arranged on the first side of the base substrate, and configured to convert a first display electrical signal into a conduction signal;

a first light-emitting element arranged on a side of the transmitter away from the base substrate, wherein the first light-emitting element emits light under a driving action of the first display electrical signal;

a receiver arranged on the second side of the base substrate, and configured to receive the conduction signal and convert the conduction signal into a second display electrical signal; and a second light-emitting element arranged on a side of the receiver away from the base substrate, wherein the second light-emitting element emits light under a driving action of the second display electrical signal.

2. The display substrate according to claim 1, wherein the conduction signal is an ultrasonic signal or an optical signal.

3. The display substrate according to claim 1, wherein a driving circuit is provided on the first side of the base substrate, and no driving circuit is provided on the second side of the base substrate.

4. The display substrate according to claim 1, wherein the transmitter is a piezoelectric transmitter, and the receiver is a piezoelectric receiver.

5. The display substrate according to claim 4, wherein the transmitter comprises:

a first transmitting electrode and a second transmitting electrode arranged opposite to each other; and a first piezoelectric material layer located between the first transmitting electrode and the second transmitting electrode, wherein the first piezoelectric material layer has an inverse piezoelectric effect.

6. The display substrate according to claim 5, wherein the receiver comprises:

a first receiving electrode and a second receiving electrode arranged opposite to each other; and a second piezoelectric material layer located between the first receiving electrode and the second receiving electrode, wherein the second piezoelectric material layer has a positive piezoelectric effect.

7. The display substrate according to claim 6, wherein an orthographic projection of a pattern of the first piezoelectric material layer on the base substrate and an orthographic projection of a pattern of the second piezoelectric material layer on the base substrate at least partially overlap, wherein the pattern of the first piezoelectric material layer is in a section perpendicular to the base substrate, and the pattern of the second piezoelectric material layer is in a section perpendicular to the base substrate.

8. The display substrate according to claim 6, wherein the first piezoelectric material layer comprises a piezoelectric crystal or a piezoelectric polymer film; and the second piezoelectric material layer comprises a piezoelectric crystal or a piezoelectric polymer film.

9. The display substrate according to claim 1, wherein the first light-emitting element comprises a first electrode and a second electrode arranged opposite to each other, and a first light-emitting layer located between the first electrode and the second electrode, and wherein the second light-emitting element comprises a third electrode and a fourth electrode arranged opposite to each other, and a second light-emitting layer located between the third electrode and the fourth electrode.

10. The display substrate according to claim 9, wherein the transmitter comprises a first transmitting electrode and a second transmitting electrode; and wherein the first transmitting electrode is electrically coupled to the first electrode of the first light-emitting element, and the second transmitting electrode is electrically coupled to a first reference potential.

11. The display substrate according to claim 10, further comprising: a thin film transistor arranged on the first side of the base substrate, and wherein both the first transmitting electrode and the first electrode are electrically coupled to a source electrode of the thin film transistor, or both the first transmitting electrode and the first electrode are electrically coupled to a drain electrode of the thin film transistor.

12. The display substrate according to claim 9, wherein the receiver comprises a first receiving electrode and a second receiving electrode, and wherein the first receiving electrode is electrically coupled to the third electrode of the second light-emitting element, and the second receiving electrode is electrically coupled to a second reference potential.

13. The display substrate according to claim 1, wherein the display substrate further comprises a compensation circuit, and wherein the compensation circuit is configured to compensate the conduction signal or the second display electrical signal, so that the second display electrical signal is substantially the same as the first display electrical signal.

14. The display substrate according to claim 13, wherein the compensation circuit is arranged on the second side of the base substrate.

15. A method for manufacturing a display substrate, comprising:

providing a base substrate having a first side and a second side opposite to each other;

forming a transmitter on the first side of the base substrate, wherein the transmitter is configured to convert a first display electrical signal into a conduction signal;

forming a first light-emitting element on a side of the transmitter away from the base substrate, wherein the first light-emitting element emits light under a driving action of the first display electrical signal;

forming a receiver on the second side of the base substrate, wherein the receiver is configured to receive the conduction signal and convert the conduction signal into a second display electrical signal; and forming a second light-emitting element on a side of the receiver away from the base substrate, wherein the second light-emitting element emits light under a driving action of the second display electrical signal.

16. The method according to claim 15, wherein forming a first light-emitting element on a side of the transmitter away from the base substrate comprises:

forming a first electrode of the first light-emitting element on a side of the transmitter away from the base substrate;

forming a first light-emitting layer of the first light-emitting element on a surface of the first electrode away from the base substrate; and forming a second electrode of the first light-emitting element on a surface of the first light-emitting layer away from the base substrate.

17. A display panel comprising the display substrate according to claim 1.

18. A display device comprising the display panel according to claim 17.

19. The method according to claim 16, wherein forming a second light-emitting element on a side of the receiver away from the base substrate comprises:

forming a third electrode of the second light-emitting element on a side of the receiver away from the base substrate;

forming a second light-emitting layer of the second light-emitting element on a surface of the third electrode away from the base substrate; and forming a fourth electrode of the second light-emitting element on a surface of the second light-emitting layer away from the base substrate.

20. The display substrate according to claim 6, wherein an orthographic projection of a pattern of the second piezoelectric material layer on the base substrate covers an orthographic projection of a pattern of the first piezoelectric material layer on the base substrate, wherein the pattern of the first piezoelectric material layer is in a section perpendicular to the base substrate, and the pattern of the second piezoelectric material layer is in a section perpendicular to the base substrate.

* * * * *